(12) United States Patent
Ehberger et al.

(10) Patent No.: US 11,545,338 B2
(45) Date of Patent: Jan. 3, 2023

(54) CHARGED PARTICLE BEAM APPARATUS AND METHOD OF CONTROLLING SAMPLE CHARGE

(71) Applicant: ICT Integrated Circuit Testing Gesellschaft für Halbleiterprüftechnik mbH, Heimstetten (DE)

(72) Inventors: Dominik Patrick Ehberger, Ebersberg (DE); John Breuer, Munich (DE); Alex Goldenshtein, Nes-Ziona (IL)

(73) Assignee: ICT Integrated Circuit Testing Gesellschaft für Halbleiterriftechnik mbH, Heimstetten (DE)

( * ) Notice: Subject to any disclaimer, the term of this patent is extended or adjusted under 35 U.S.C. 154(b) by 0 days.

(21) Appl. No.: 17/308,832

(22) Filed: May 5, 2021

(65) Prior Publication Data
US 2022/0359152 A1    Nov. 10, 2022

(51) Int. Cl.
| H01J 37/28 | (2006.01) |
| H01J 37/20 | (2006.01) |
| H01J 37/10 | (2006.01) |
| H01J 37/26 | (2006.01) |
| H01J 37/244 | (2006.01) |

(52) U.S. Cl.
CPC .............. *H01J 37/28* (2013.01); *H01J 37/10* (2013.01); *H01J 37/20* (2013.01); *H01J 37/244* (2013.01); *H01J 37/265* (2013.01); *H01J 2237/049* (2013.01); *H01J 2237/2817* (2013.01); *H01J 2237/2826* (2013.01)

(58) Field of Classification Search
CPC .. H01J 37/00; H01J 37/02; H01J 37/26; H01J 37/28; H01J 37/10; H01J 37/20; H01J 37/244; H01J 37/265; H01J 2237/049; H01J 2237/2817; H01J 2237/2826
USPC ........................................ 250/306, 307, 311
See application file for complete search history.

(56) References Cited

U.S. PATENT DOCUMENTS

| 6,690,010 | B1 * | 2/2004 | Adler ................. G01N 23/2251 850/16 |
| 10,168,614 | B1 | 1/2019 | Goldenshtein et al. |
| 2008/0265159 | A1 * | 10/2008 | Hatakeyama ........ G01N 23/225 250/306 |

OTHER PUBLICATIONS

Gong et al., Nonlinear Photoemission Electron Micrographs of Plasmonic Nanoholes in Gold Thin Films, 2014, Journal of Physical Chemistry, 118, pp. 25671-25676. (Year: 2014).*

* cited by examiner

*Primary Examiner* — Jason L McCormack
(74) *Attorney, Agent, or Firm* — Kilpatrick Townsend & Stockton LLP

(57) ABSTRACT

A charged particle beam apparatus with a charged particle source to generate a primary charged particle beam, a sample holder to hold a sample for impingement of the primary charged particle beam on the sample, a pulsed laser configured to generate a pulsed light beam for impingement onto an area on the sample, and an electrode to collect electrons emitted from the sample in a non-linear photoemission.

16 Claims, 4 Drawing Sheets

CHARGED PARTICLE BEAM APPARATUS AND METHOD OF CONTROLLING SAMPLE CHARGE

TECHNICAL FIELD

Embodiments of the present disclosure relate to charged particle beam apparatuses, particularly charged particle beam apparatuses with sample charge control, and a method of controlling sample charge. Embodiments of the present disclosure particularly relate to the induction of a non-linear photoemission to control the sample charge. Specifically, embodiments of the present disclosure relate to a charged particle beam apparatus and a method of controlling sample charge in a charged particle beam apparatus.

BACKGROUND

Charged particle devices are utilized in the measurement, sensing, probing and imaging of samples. A charged particle beam is directed onto the sample, and a measurable signal is generated based on the interaction of the sample with the charged particle beam. Such interaction can include the absorption, scattering or reflection of particles included in the charged particle beam, or the generation of secondary photon and/or particle radiation.

Examples for charged particle devices are electron microscopes, such as scanning electron microscopes, ion microscopes such as focused ion beam, $O_2^-$- or $He^+$-ion microscopes, or apparatuses for electron beam inspection, critical dimension measurements, defect review, or the like. Exposing a sample to the charged particle beam can create an electric charge on or within the sample, particularly if the sample includes insulated or low- or non-conductive portions. A high sample charge can have detrimental effects, such as the deterioration of the sensed signal or image quality, e.g. due to electrostatic effects, or damage to the sample.

Known methods for controlling the sample charge include grounding the sample, e.g. by sputtering the sample, the use of short wavelength radiation, i.e. ultraviolet radiation to induce photoemission, the use of extraction fields or the introduction of compensating charges with flood guns, such as electron flood guns. The known methods can have several drawbacks, such as being time-consuming, requiring extensive sample preparation or specific sample design, or risking radiation damage or the introduction of contaminants into the sample or the apparatus. Due to the problems associated with conventional sample discharging techniques, there has been a long-felt need to improve upon existing methods for controlling the sample charge in a charged particle beam apparatus.

In view of the above, it is beneficial to provide an improved system or method to control a sample charge in a charged particle beam apparatus.

SUMMARY

According to an embodiment, a charged particle beam apparatus is described. The charged particle beam apparatus includes a charged particle source to generate a primary charged particle beam, a sample holder to hold a sample for impingement of the primary charged particle beam on the sample, a pulsed laser configured to generate a pulsed light beam for impingement onto an area on the sample, and an electrode to collect electrons emitted from the sample in a non-linear photoemission.

According to an embodiment, a method of controlling sample charge in a charged particle beam apparatus is described. The charged particle beam apparatus directs a primary charged particle beam onto an area on the sample. The method includes directing a pulsed light beam onto the sample. The photon energy of the pulsed light beam is lower than the work function of the sample, and a pulse of the pulsed light beam has an intensity to promote a non-linear photoemission of electrons from the sample.

According to an embodiment, a charged particle beam apparatus is described. The charged particle beam apparatus includes a charged particle source to generate a primary charged particle beam; a sample holder to hold a sample for impingement of the primary charged particle beam on the sample, and a light source configured to generate a pulsed light beam for impingement onto an area on the sample. The photon energy of the pulsed light beam is lower than the work function of the sample. The charged particle beam apparatus further includes an intensity modulator. The intensity modulator is configured to adjust the intensity of a pulse of the pulsed light beam generated by the light source to generate a non-linear photoemission of electrons from the sample. The charged particle beam apparatus further includes a controller configured to control the light source to generate the pulsed light beam, the controller controlling the light source to generate a pulse of the pulsed light beam synchronized to a line-scan frequency or frame scan frequency of the charged particle beam, and/or to generate a pulse of the pulsed light beam with a variable pulse intensity, the pulse intensity corresponding to a surface charge of the area on the sample.

Aspects of the disclosure generally relate to an application of the photoelectronic effect, particularly photoemission, which should be understood as the phenomenon of emission of electrons from a material caused by light quanta. It is known that solids, such as metals, semiconductors or inorganic materials, show linear photoemission when the photon energy of a light incidence exceeds the work function or binding energy of electrons within the material. Generally, the required energies lie within the range of several electron volts (eV) and thus require short wavelength light, e.g. in the ultraviolet (UV) range, to exhibit photoelectronic emission.

Aspects of the disclosure further relate to the application of non-linear photoemission, which describes a photoelectronic phenomenon that occurs despite the photon energy being lower than the work function of the emitting material. Non-linear photoemission can be defined by the condition $$n \cdot E_{ph} > \Phi \text{ only if } n \geq 2, \text{ where } E_{ph} = h\nu$$

h being Planck's constant, ν being the light frequency and Φ being the work function of the electrons in the material. Currently accepted models for mechanisms resulting in non-linear photoemission describe a multiphoton absorption, such as a two- or three-photon absorption within the material, as well as the generation of plasmons within the material, potentially affected by junction-like effects, e.g. such as exhibited by Schottky barriers. In the context of this disclosure, all mechanisms, such as, for example, strong-field light-solid interactions, multi-harmonic generation, as well as perturbative multi-photon induced photoemission shall be understood as being suitable for inducing a non-linear photoemission. Non-linear photoemission can generally occur at longer wavelengths (i.e. lower photon energies) than linear photoemission, such as in the visible light spectrum or in the near-infrared or even far-infrared range, provided that the intensity of the incidence is sufficiently high. A sufficiently high intensity of the light incidence can particularly be provided in the form of short or ultrashort pulses.

BRIEF DESCRIPTION OF THE DRAWINGS

So that the above recited features can be understood in detail, a more particular description, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

In the following description, an apparatus utilizing an electron beam may be understood as a charged particle beam apparatus. A charged particle beam apparatus can include a scanning charged particle apparatus, such as a scanning electron microscope, or a (scanning) electron beam inspection. Examples of commercially available electron beam inspection systems or apparatuses are apparatuses of the PROVISION™ product line available from Applied Materials, Inc., Santa Clara, USA. Unless otherwise specified, a charged particle beam should be understood as a primary charged particle beam, i.e. the charged particle beam generated by a charged particle beam source. Charged particles not forming part of the primary charged particle beam, such as particles emitted by or from the sample, should be understood as secondary charged particles, particularly secondary electrons, or backscattered charged particles, particularly backscattered electrons. Generally, particles emitted by or from the sample, particularly upon impingement of the primary charged particle beam and measured, e.g. for image generation, can be referred to as signal charged particles or signal electrons. When referring to a light beam, it is generally understood that, in the context of this disclosure, a light beam can include pulsed light beams or separate pulses of a pulsed light beam. When referring to charge control, the reduction of the (surface) charge of a charged sample, preferably the neutralization of the (surface) charge of a charged sample is described.

Figure 1:
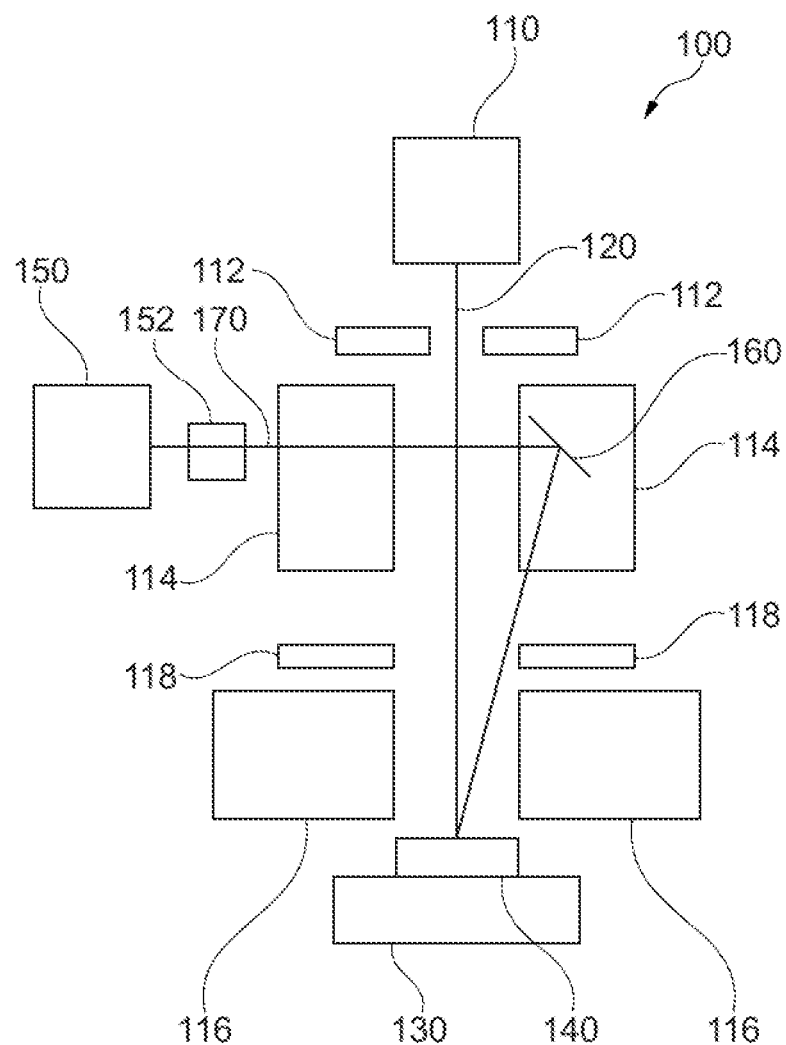
FIG. 1 shows a schematic drawing of a charged particle beam apparatus according to embodiments.

FIG. 1 shows a charged particle beam apparatus 100 according to an embodiment. The charged particle beam apparatus 100 includes a charged particle source 110 and a sample 140 provided on a sample holder 130. The charged particle source 110 is configured to emit charged particles, particularly primary charged particles. The primary charged particles can include e.g. electrons or ions. The charged particles generated and/or emitted by the charged particle source 110 can be accelerated by the electrode 112 to form a primary charged particle beam 120. The charged particle beam apparatus 100 can include a bender unit 114. The bender unit 114 can be configured to separate secondary charged particles, such as up-coming secondary electrons emitted after impingement of the primary charged particle beam 120 on the sample 140, from the primary charged particle beam 120. The charged particle beam apparatus 100 can further include one or more objective lenses, such as the objective lens 116. The charged particle beam apparatus may include a scanner, such as a scanning deflector, known in the art, for scanning the primary charged particle beam 120 across an area on the sample 140. The scanner may be included in the objective lens 116, or provided elsewhere in the charged particle beam apparatus.

The objective lens 116 can be configured for focusing the charged particle beam 120 onto the sample 140, e.g. onto a defined area or spot on the sample 140. The charged particle source 110 can include a charged particle emitter, e.g. an ion source or an electron emitter, such as an electron gun. The electrode 112 can be configured for controlling and/or defining the charged particle beam 120. The objective lens 116 can include a bore configured to allow the charged particle beam 120 to pass through the bore as the primary charged particle beam propagates from the charged particle source to the sample 140. The charged particle beam apparatus 100 can be configured, e.g. by controlling the scanner, to direct the charged particle beam 120 onto specified positions on the surface of the sample 140, e.g. along a predefined path, such as in or along a scanning pattern. The bender unit 114 may be configured to create an offset of the primary charged particle beam 120 from the axis of the objective lens 116. The offset can beneficially enable the mirror 160 to be positioned on the axis of the objective lens 116 without interfering with the primary charged particle beam 120. An example for a charged particle beam apparatus including a bender unit is provided in document U.S. Ser. No. 10/168,614B1.

The charged particle beam apparatus 100 can include one or more sensors or detectors, such as detector 118, to detect a signal generated by the interaction of the charged particle beam 120 with the sample. The detector 118 may detect charged particles, e.g. signal charged particles, emitted or reflected from the sample 140, particularly upon impingement of the primary charged particle beam 120 on the sample 140. The detector 118 may, additionally or in combination, collect electrons emitted during a non-linear photoemission, according to embodiments described herein, and/or sense a current corresponding to the number of collected electrons. The detector may include an electrode configured to collect electrons emitted from the sample in a non-linear photoemission. The detector 118 may be configured for sensing, directly or indirectly, a surface charge or an electric field of the sample 140, according to embodiments described herein. The sensor may be a detector configured to detect a signal generated by charged particles on impingement of the primary charged particle beam 120 on the sample 140. Detectable signals include, but are not limited to, scattered and/or backscattered charged particles of the primary charged particle beam 120 such as backscattered electrons, secondary low-energy electrons, photonic radiation such as heat, light, or X-ray emission, secondary low-energy electrons, or the like. The sensed signal can be utilized e.g. for the imaging or characterization of the sample 140, e.g. by scanning the sample 140, by generating an image, e.g. on a screen, by spectroscopic methods or the like.

The sample holder 130 holds the sample 140 for impingement of the primary charged particle beam 120 on the sample 140. The sample holder 130 can be configured for maintaining a defined position of the sample 140 within the charged particle beam apparatus 100, particularly during operation of the charged particle beam apparatus 100. The sample holder 130 can be configured for moving and/or rotating the sample 140, e.g. along a direction substantially perpendicular to the charged particle beam 120. The sample holder 130 can be configured for sequentially receiving, e.g. by an automated system such as a robot or a loading and unloading mechanism, one or more samples to be analyzed in the charged particle beam apparatus 100. Movement of the sample 140 can allow the scanning or impingement of different areas on the sample 140, or the analyzing of different samples, thus allowing e.g. the imaging of different areas on the sample 140 or further samples. Different types of sample holders 130 can be suitable, e.g. the sample holder can include a plate, such as a solid metal plate, and/or a ceramic plate, for providing the sample 140 thereon. A ceramic plate may be chosen if the sample is supposed to be biased with a high voltage. The sample holder 130 can further include one or more openings or apertures for allowing the charged particle beam 120 and/or particles or radiation generated during the interaction between the sample 140 and the charged particle beam to be transmitted through the sample 140 and the one or more opening within the sample holder 130. Suitable sample holders include, but are not limited to, known sample holders used in the art in scanning electron microscopes, transmission electron microscopes, electron beam inspection systems or apparatuses, ion beam microscopes or the like.

The charged particle beam apparatus 100 further includes a light source 150 configured to generate a pulsed light beam 170. The light source 150 can be a laser light source, particularly a pulsed laser. In the embodiment shown in FIG. 1, the pulsed light beam 170 is introduced into the charged particle beam apparatus 100 approximately parallel to the surface of sample 140 and redirected by the mirror 160 for impingement onto an area of the sample 140. According to embodiments, the angle of impingement of the light beam 170 onto the sample 140 can be perpendicular, substantially or approximately perpendicular or at an angle of 60°-90°, more preferably 80°-90° relative to a surface of the sample 140. A substantially perpendicular impingement can improve, i.e. promote, the non-linear photoemission provided according to embodiments of the present disclosure.

The area of the sample 140 impinged by the light beam 170 can be the area impinged by the primary charged particle beam 120. The area impinged by the light beam 170 can be of equal size or larger than the area impinged by the charged particle beam 120, particularly if the charged particle beam 120 is focused as a spot onto an area of the sample 140. In a beneficial example, if the charged particle beam apparatus 100 is configured to scan the charged particle beam 120 across a scan area on the sample 140, the area on the sample 140 impinged by the light beam can correspond to or cover the scan area or a portion of the scan area. The scan area can be the area scanned along a scan path by a spot of the primary charged particle beam 120 on the sample 140. In embodiments having an enclosure such as a vacuum chamber, the pulsed laser or the light source 150 or parts of the pulsed laser or the light source 150 can be provided outside the enclosure. In the embodiment shown in FIG. 1, the intensity of the light beam 170 is modulated by an intensity modulator, particularly the intensity attenuator 152 provided along the path of the light beam 170 between the light source 150 and the mirror 160. The intensity attenuator 152 may be a commercially available laser beam attenuator. Other types of intensity modulators, e.g. according to embodiments described herein, may be provided instead of or in addition to the intensity attenuator 152. The mirror 160 can be disposed within the bender unit 114 of the charged particle beam apparatus 100. Providing the mirror as shown in FIG. 1, i.e. within the bender unit 114, can result in a beneficial impingement angle.

According embodiments of the present disclosure, which can be combined with other embodiments described herein, a light source is described. The light source can particularly be a laser light source, such as a pulsed laser.

According to embodiments, light, particularly pulsed light, can be generated by the pulsed laser and transmitted or directed along a length of an optical fiber arrangement before the light beam 170 is formed, preferably upon exiting the optical fiber arrangement. The light transmitted by an optical fiber arrangement can be understood as a light beam. The pulsed laser can include the optical fiber arrangement.

The configuration of the light source 150 or the pulsed laser and the mirror 160 as shown e.g. in FIG. 1 beneficially does not interfere with the generation, forming (i.e. focusing and/or bending) and/or propagation of the charged particle beam 120. Furthermore, the risk of introducing contaminants into the charged particle beam apparatus 100 or onto the sample 140 remains low due to the lower number of parts required to be provided within the enclosure. Furthermore, a substantially perpendicular angle of impingement can be obtained. A substantially perpendicular angle of impingement may beneficially increase non-linear photoemission at lower intensities.

According to embodiments, the charged particle beam apparatus 100, particularly the pulsed laser, includes an intensity modulator, such as the intensity attenuator 152 shown in FIG. 1. The intensity modulator is configured to adjust the intensity of a pulse of the pulsed light beam 170 generated by the pulsed laser. The intensity modulator may include, but is not limited to, devices reducing the intensity of an existing light beam, devices controlling the intensity of the light beam during generation of the light beam, and/or devices controlling the area impinged by the pulsed light beam. An intensity of a light beam is the power transferred per unit area on the sample 140. The intensity of a pulse of the pulsed light beam 170 may be higher, e.g. significantly higher, than the continuous intensity of the light beam 170.

According to embodiments, the intensity modulator may control the duration of a pulse of the pulsed light beam 170. The intensity modulator may be a pulse-width modulator, particularly a pulse-width modulator included in the light source 150 or the pulsed laser. It is generally understood that a light pulse having an energy will have a higher power or intensity when the energy is transferred within a shorter time, i.e. the power and/or intensity of the pulse can be increased by reducing the pulse duration, and decreased by increasing the pulse duration. Controlling the pulse duration may be performed by controlling the light source or properties of the light source, according to embodiments described herein, particularly in the context of laser light sources. In some embodiments, the intensity modulator may be realized in or included in the light source or be a controllable property of the light source.

According to embodiments, the intensity modulator may control the area impinged by the pulsed light beam 170, e.g. the size of the impinged area on the sample 140. The intensity modulator may be a focusing assembly, e.g. an optical assembly such as a lens assembly and/or a mirror assembly configured to focus the light beam 170 onto a controlled area on the sample 140. The mirror 160 may be included in the focusing assembly. The focusing assembly may be, fully or in part, included in the light source 150. The focusing assembly may be configured for focusing the light beam 170 onto varying areas or areas with different sizes on the sample 140. It is generally understood that a light beam having a power will have a higher intensity if the light beam impinges, i.e. is confined to, on a smaller area, i.e. the intensity of the light beam 170 can be increased by reducing the area of the sample 140 impinged by the light beam 170, e.g. by confining the light beam 170 to a smaller area, and the intensity may be decreased by increasing the impinged area.

According to embodiments, the intensity modulator may control the power of a pulse of the pulsed light beam 170, e.g. with a pulse power modulator. It is generally understood that a pulse of a pulsed light beam having a higher power will have a higher energy and a higher intensity. The power of a pulse of the pulsed the light beam 170 may be increased by controlling the light source 150, e.g. if the pulsed laser is configured for generating pulses with varying power. The light source 150 may include a pulse power modulator.

According to embodiments, the power of a pulse of the pulsed light beam 170 may be attenuated by providing filters or other optical components, such as the intensity attenuator 152 shown in FIG. 1, along the path of the light beam 170. According to embodiments, known attenuators, such as commercially available laser beam attenuators may be utilized.

According to embodiments, various combinations of two, three or four types of intensity modulators as described herein can be utilized.

According to embodiments, the light beam 170 is focused for impingement onto an area on the sample, particularly onto a defined area on the sample, e.g. by utilizing the focusing assembly. The focusing can confine the effects induced by the light beam 170. Particularly, the effects of the light beam, i.e. inducing non-linear photoemission in undesired locations, are limited to a small volume in the optical path. Conventional systems for controlling sample charge may undesirably induce linear photoemission everywhere, particularly where the light beam or a fraction of the light beam hits or impinges on, such as within undesired locations or components of the charged particle beam apparatus 100.

According to embodiments, the intensity modulator is configured to adjust the intensity of a pulse of the pulsed light beam 170 generated by pulsed laser to generate a non-linear photoemission of electrons from the sample 140. Inducing the non-linear photoemission of electrons from the sample 140 is an intended effect of the apparatuses and methods described herein. According to embodiments, the generation of secondary electrons caused by non-linear photoemission can be utilized, e.g. by sensing and/or quantifying the non-linear photoemission, to control the pulsed laser and/or intensity modulator described herein. The non-linear photoemission of electrons from the sample 140 can be quantified, e.g. by measuring a current and/or a surface charge (or the difference of a surface charge before and after an impingement of a light pulse) of the sample 140 according to embodiments described herein, and the intensity modulator can be adjusted according to the quantified value. In one example not to be understood as a limitation, the light source 150, e.g. in combination with the intensity modulator, can provide a series of light pulses with increasing intensity until a non-linear photoemission is detected. According to beneficial embodiments, adjusting the intensity of a pulse of the pulsed light beam can be performed by the intensity modulator for a wide range of different samples without requiring information on the sample material composition or structure.

According to an embodiment, the light source 150 is a pulsed laser configured to emit a pulsed light beam including one or more ultrashort light pulses with a pulse length in the order of 1 picosecond or below. Various types of lasers and/or methods for producing ultrashort pulses are known. In the art, ultrashort pulses typically refer to pulses in the picosecond to femtosecond range, however, also shorter pulses in the attosecond time scale can be understood as ultrashort pulses. According to beneficial embodiments, the duration of an ultrashort light pulse can be below 500 femtoseconds, below 100 femtoseconds, below 50 femtoseconds or even below 10 femtoseconds. Known suitable laser types configured to emit ultrashort pulses include, but are not limited to: Ti:sapphire lasers and/or dye lasers, Yb:YAG lasers, thin disk lasers, fiber lasers, lasers utilizing chirped pulse amplification, mode locked lasers, lasers utilizing the Kerr effect, lasers utilizing nonlinear polarization rotation or the like. The pulse duration, the maximum attainable average power, and/or the wavelength, may be variable depending on the type of laser. By providing the light pulses as ultrashort pulses, sufficiently high intensities of the pulsed light beam 170 can be generated, while the average power transmitted to the sample over time remains low enough to avoid damaging the sample, e.g. by overheating or dielectric breakdown.

According to an embodiment, a pulse of the pulsed light beam emitted by the pulsed laser has a pulse peak power of more than 1 megawatt (MW), particularly more than 5 MW or even more than 10 MW. The energy of a pulse of the pulsed light beam may be above 0.5 microJoule ($\mu J$), above 1 $\mu J$, above 5 $\mu J$, above 10 $\mu J$, or even above 50 $\mu J$. According to embodiments, the energy of a pulse of the pulsed light beam may be above 0.1 milliJoule (mJ), above 0.3 mJ, above 0.5 mJ, above 1 mJ or even above 2 mJ. In one example, the light beam may include a series of pulses with a pulse length of 1 picosecond. The continuous power of the light beam may be 100 mW with a pulse repetition rate of 100 kHz. The pulse may have an energy of 1 $\mu J$ and a power of 1 MW.

According to an embodiment, a pulse of the pulsed light beam emitted by the light source 150 has a wavelength above 300 nm, particularly above 400 nm, above 500 nm, above 600 nm, above 700 nm or even above 800 nm. The wavelength may be tunable, particularly tunable in relation to a sample type. According to an example, the wavelength may be tuned, preferably by a controller and/or a sensor connected to a controller, such as the controller described with reference to embodiments described herein, to be short enough to cause a non-linear photoemission in the sample 140 and long enough to not cause detrimental effects such as radiation damage to the sample 140. The wavelength may be controlled such that the wavelength, i.e. the photon energy, is below the work function of the sample 140. The wavelength may be controlled such that no linear photoemission is induced in the sample, particularly while a non-linear photoemission is induced in the sample. It is understood that ultrashort pulses can have a broadband optical spectrum, and the above referenced wavelength ranges can therefore refer to the peak intensity wavelength of the light pulse, or, particularly if the light pulse is a very broadband light pulse, to the average wavelength of the light pulse.

According to embodiments, as shown in FIG. 1, the charged particle beam apparatus 100 is configured to receive a sample 140. The charged particle beam apparatus 100 can be configured to receive various types of sample 140, particularly samples typically known to be suitable for being measured in conventional charged particle beam apparatuses such as electron microscopes or electron beam inspection apparatuses, such as the devices described in the introductory portion of this disclosure. The charged particle beam apparatus 100 can be particularly suitable for samples comprising one or more semiconductor portions and/or one or more insulating portions. Such samples include, but are not limited to, processed or unprocessed wafers, such as silicon wafers, electric or electronic circuits, such as a circuit for manufacturing integrated devices, such as circuits obtained by lithographic processing, particularly computer chips, display devices at various stages of manufacturing, samples comprising metallic or semi-conductive portions on a non-conductive carrier, samples comprising organic portions such as polymers, e.g. as carriers or buildup layers, samples comprising ceramic portions, e.g. as carriers, and the like. Further suitable samples include masks, such as photolithographic masks, particularly photolithographic masks known in the art, e.g. as used in the manufacturing or processing of samples as described above. Further samples may include, particularly in addition to the sample portions described herein, calibration and/or resolution measurement targets. Specific examples for suitable samples include, but are not limited to, samples having high aspect ratio memory hole channels provided in an insulating stack, particularly where imaging of a contact bottom is required, and/or deep trenches in thick insulators, particularly for measuring the wall slope of the trench.

According to embodiments, the charged particle beam apparatus 100 can be configured to control, reduce or even neutralize a surface charge of a sample 140 by generating or inducing a non-linear photoemission of electrons from the sample 140. The charged particle beam apparatus 100, particularly the light source 150 can emit a pulsed light beam with a photon energy below the work function of the sample 140 or portions of the sample. For samples as described above, the work function of the sample can be above 1 eV, above 2 eV, above 3 eV, above 4 eV or even above 5 eV. Correspondingly, the charged particle beam apparatus 100 can be, depending on the current sample, configured for generating a pulsed light beam with a photon energy below the work function of the sample. The photon energy may be adjusted depending on the sample 140, i.e. the lowest possible photon energy, or a suitably high photon energy at which non-linear photoemission occurs may be chosen, e.g. by a process according to embodiments described herein in further detail.

Figure 2A:
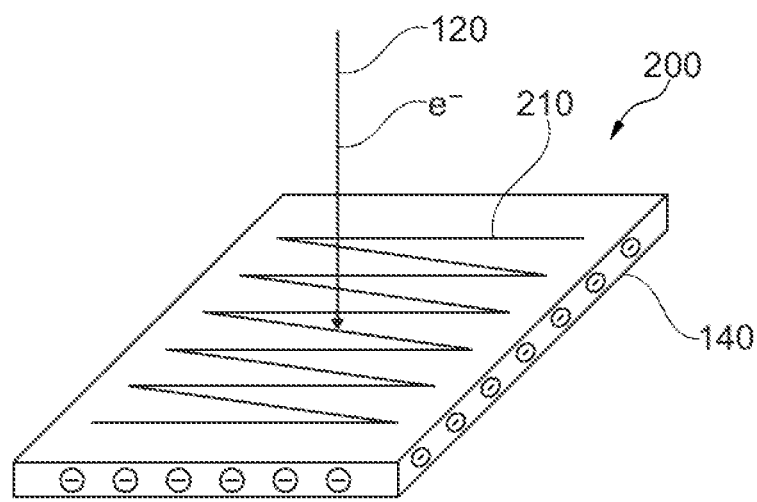
FIG. 2A shows a schematic drawing of a sample being exposed to an electron beam in a scanning electron beam apparatus according to embodiments.
Figure 2B:
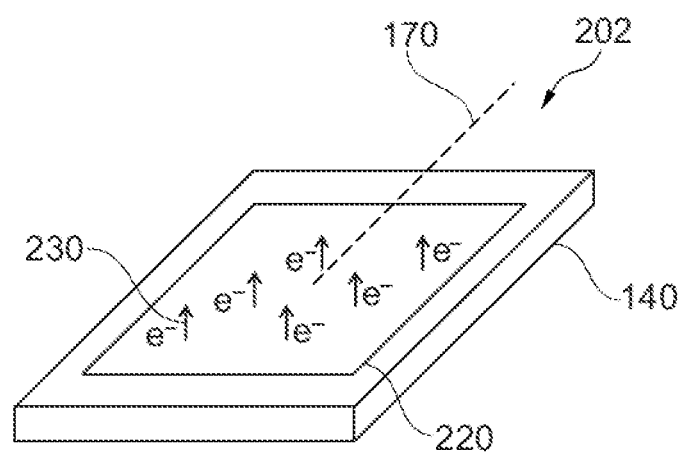
FIG. 2B shows a schematic drawing of the neutralization of an area on the sample according to embodiments.

Referring now to FIG. 2A and FIG. 2B, a process according to an embodiment is described. The process can be executed in a charged particle beam apparatus according to embodiments described herein. In the example given in FIGS. 2A and 2B, the charged particle beam apparatus is a scanning electron microscope, however, it is clear that many or all aspects of the process can be applied to any type of charged particle beam apparatus as described herein.

As shown in FIG. 2A, in operation 200, a charged particle beam 120, in the example being an electron beam, is scanned across an area on the surface of a sample 140 in a scanning pattern 210 defining a scanning area. The operation 200 can be a conventional scanning operation, e.g. of a commercially available scanning electron microscope. In the example, the sample 140 is an insulator and accumulates, as a result of receiving electrons e⁻ from the electron beam, negative charges (−) on or near the surface of the sample 140.

As shown in FIG. 2B, after a portion of the sample 140 has been scanned by the electron beam, a pulsed light beam 170 is directed onto the sample 140. The pulsed light beam 170, i.e. one or more pulses of the pulsed light beam 170, is directed onto the area 220 on the sample, the area 220 corresponding to the scanning area. The photon energy of the pulsed light beam 170 is lower than the work function of the sample, i.e. the light beam does not induce linear photoemission. The one or more pulses of the pulsed light beam 170 have an intensity, particularly a high enough intensity, to promote a non-linear photoemission of electrons from the sample. The angle at which the light beam 170 impinges onto the area on the sample in FIG. 2B can be in a range as discussed with reference to the embodiment shown in FIG. 1.

Figure 4:
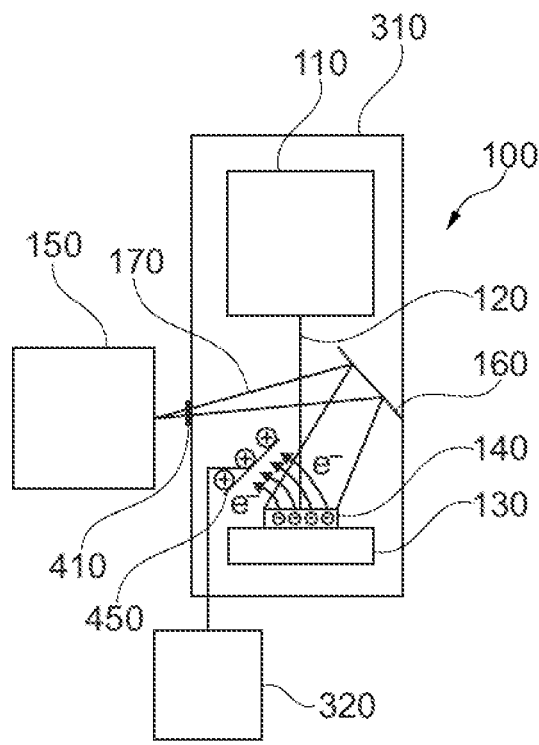
FIG. 4 shows a schematic drawing of a charged particle beam apparatus according to embodiments.

As shown in FIG. 2B, in operation 202, secondary electrons e⁻ such as the electron 230 are emitted as a result of the sample having received a pulse of the pulsed light beam 170. Generally, since the sample 140 has, at least locally, a negative surface charge, the electrons will be dispersed off the sample due to the effects of the electric field, i.e. the charge of the sample. Furthermore, the electrons 230 may be attracted towards a grounded or positively charged or biased electrode, such as the (collector) electrode 450 shown e.g. in embodiments such as in FIG. 4, provided near the sample, and/or be absorbed by the electrode. The emission of electrons 230 can reduce the charge of the sample 140 or even neutralize the charge of the sample 140. The current caused by the emission of electrons 230, particularly if the electrons are absorbed by the electrode, may be measured, and the measured signal may be utilized for quantifying the emission of electrons. The measured signal may further be utilized for controlling the intensity of the pulsed light beam, e.g. by the intensity modulator.

According to embodiments, operations 200 or 202 may be repeated for a certain number of times, or the scanning operation 200 may be interrupted after e.g. scanning a certain number of lines, to execute operation 202. In a beneficial embodiment, operation 202 may be synchronized to operation 200, i.e. a scan area may be scanned in operation 200, followed by a surface charge neutralization of the sample in operation 202, and the operations may be repeated for the same scan area, a different scan area or even a different sample. Performing the operations in a synchronized manner may beneficially improve the scanning efficiency and quality of the resulting image, since no abrupt field changes, which might result in reduced signal quality, occur whilst scanning.

Figure 3:
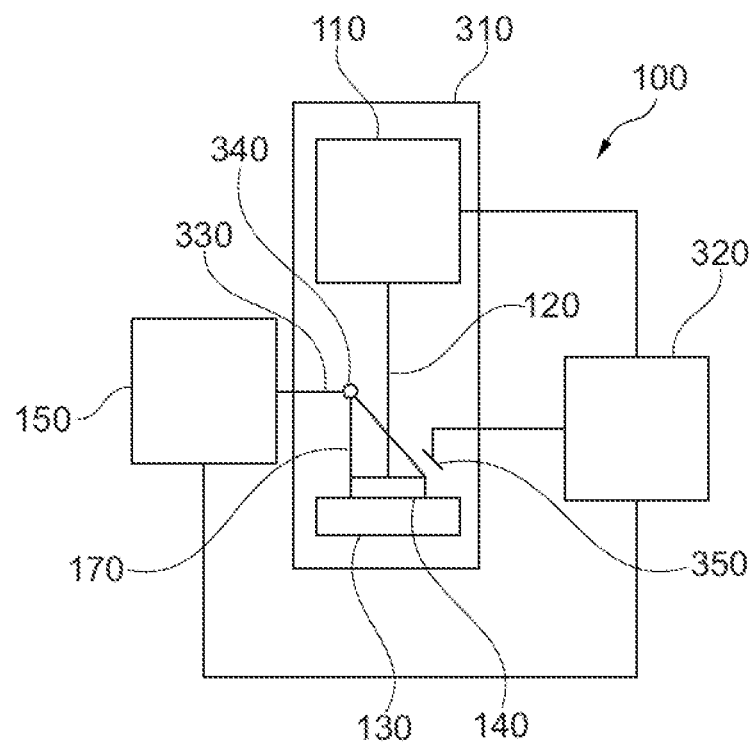
FIG. 3 shows a schematic drawing of a charged particle beam apparatus according to embodiments.

Referring now to FIG. 3, a charged particle beam apparatus 100 according to an embodiment is described. The charged particle beam apparatus 100 may include several or all of the components described with reference to FIG. 1, such as the electrode 112, the bender unit 114, the objective lens 116 and/or the detector 118. Only specific features of the embodiment shown in FIG. 3 shall be discussed in detail, and the features can be combined with other embodiments described herein. The charged particle beam apparatus 100 includes an enclosure 310. The enclosure encloses the charged particle source 110, the sample 140 and the sample holder 130. The enclosure further encloses a sample charge sensor 350 provided near the sample 140, and a focusing assembly 340. The sample charge sensor 350 may include a detector such as the detector 118 shown in FIG. 1. The pulsed laser and a controller 320 are provided outside the enclosure. The enclosure 310 can be configured for providing conditions suitable for performing sensing or imaging with the charged particle beam apparatus 100, such as providing a vacuum, particularly a low vacuum or a high vacuum depending on the type of sensing or imaging performed with the charged particle beam apparatus 100, such conditions being known in the art. The enclosure 310 can be fluidly connected to a vacuum source.

The charged particle beam apparatus 100 includes a controller 320, the controller 320 being connected to the charged particle source 110, the light source 150 and the sample charge sensor 350. The connection between the controller 320 and the charged particle source 110 in combination with the connection between the controller 320 and the light source 150 can be utilized by the controller to synchronize the operation of the charged particle source 110 and the light source 150, such as or similar to operation 200 and operation 202. The controller 320 can be configured for controlling the light source 150 to generate a pulse of the pulsed light beam 170 synchronized to a line-scan frequency or frame scan frequency of the charged particle beam 120. The controller 320 can further be connected to the focusing assembly 340, which can function as an intensity modulator. The connection between the controller 320 and the light source 150 and/or the focusing assembly 340 can be utilized to control the light source 150 by the controller 320, particularly aspects of the light beam 170, such as the intensity of the light beam 170, the pulse number, the pulse timing or the like. The controller 320 can be configured for controlling the light source 150 to generate a pulse of the pulsed light beam 170 with a variable pulse intensity. The pulse intensity can correspond to a surface charge of the area on the sample 140.

According to embodiments, as shown in FIG. 3, the sample charge sensor 350 is configured to sense a charge of the sample. The sample charge sensor 350 can be configured to sense an electric field of the sample 140, particularly a static electric field or an electrostatic charge, particularly a charge resulting from the accumulation of charges on or within the sample 140 due to interaction with the primary charged particle beam 120. The sample charge sensor 350 may sense an electric charge of the sample 140 and provide the sensed sample charge to the controller 320. The sample charge sensor may be provided near the sample 140 as shown in FIG. 3, furthermore, the sample charge sensor 350 may be included in the sample holder 130, the detector 118 or elsewhere inside the enclosure 310. According to embodiments, the sample charge sensor 350 may include an electrode, such as a metal plate, and an amplification circuit (not shown), the amplification circuit amplifying and providing a sensed signal to the controller. According to embodiments, the sample charge sensor 350 may include an electro-optic device, e.g. an electro-optic sensor for static fields. Further types of sensors are known in the art. The controller 320 can be configured to determine a sample charge, and, e.g. when the sample charge exceeds a threshold, to perform a sample charge neutralization, such as operation 202. Furthermore, by comparing the sample charge before and after a sample charge neutralization, the effectiveness of the sample charge neutralization may be determined. The controller 320 may be configured to control and/or modulate, e.g. by an intensity modulator, the pulse intensity of a pulse of the pulsed light beam according to the sensed sample charge. The controller 320 may automatically adjust parameters of the light source 150 or the intensity modulator, e.g. focusing assembly 340, according to the sensed sample charge. By sensing the charge of the sample, it can be determined, e.g. if the sample charge exceeds a threshold, if a sample charge control operation, such as operation 202, is desirable, and be performed accordingly. Furthermore, the sample charge control operation can efficiently be performed without requiring additional information about the sample 140.

As shown in FIG. 3, according to embodiments, the light source 150 or the pulsed laser may be provided outside the enclosure 310 and transfer light along an optical fiber arrangement 330 inside the enclosure. The light transferred via the optical fiber arrangement 330 may be shaped by the focusing assembly 340 into a freely propagating light beam 170. The focusing assembly 340 may include an optical arrangement, such as a lens and/or mirror arrangement described herein, for focusing the light beam 170 onto an area on the surface of the sample 140 for impingement onto the area on the sample 140. The focusing assembly 340 may include a mirror, such as the mirror 160 described with reference to FIG. 1.

Referring now to FIG. 4, a charged particle beam apparatus 100 according to an embodiment is described. The charged particle beam apparatus 100 can include several of the elements of the embodiments shown in FIG. 1 and/or FIG. 3, which shall not be described again in detail and have been omitted in the drawing. The charged particle beam apparatus 100 includes an enclosure 310. The light beam 170 may be generated in the light source 150 or the pulsed laser provided outside the enclosure 310 and may enters the enclosure 310 through a window 410. Other configurations for introducing the light beam 170, according to embodiments described herein, can be equally suitable.

In the embodiment, the controller 320 is connected to an electrode 450. The electrode may include the detector 118 shown in FIG. 1. As shown in FIG. 4, the electrode 450 can be positively charged, e.g. biased, particularly with respect to the negatively charged sample 140. The electrode 450 may be, directly or indirectly, e.g. via the controller 320, grounded, or have a positive voltage applied thereto. The electrode may be electrically connected, e.g. directly or through the controller 320, to the charged particle beam apparatus 100 or elements of the charged particle beam apparatus 100, such as the enclosure 310. When a secondary emission, i.e. a non-linear photoemission is induced by exposing the sample 140 to a light beam, electrons $e^-$ are emitted from the sample 140 and attracted to the electrode 450. The electrode 450 can collect at least a portion of the electrons emitted in the non-linear photoemission. The collected electrons $e^-$ can result in a current, the current being measurable by the controller 320. Measuring the current of electrons collected by the electrode 450 can be utilized to quantify the non-linear photoemission from the sample 140. Particularly, the quantified current can be utilized to control, with the controller 320, the light source 150 and/or an intensity modulator, such as the intensity attenuator 152 or the focusing assembly 340, particularly the intensity, pulse duration, wavelength, pulse number, pulse power of the light beam, or any combination thereof. Particularly, the controller 320 can be configured to adjust the pulse intensity of a pulse of the pulsed light beam 170 to control the number of electrons emitted from the sample 140 according to the surface charge of the sample 140. In one example, if no electrons are collected by the electrode 450 after a pulse of the pulsed light beam, the intensity and/or wavelength of the pulsed light beam 170 may be increased until a non-linear photoemission is detected.

According to an embodiment, the electrode 450 can be a mirror. According to a beneficial example, the electrode 450 can be the mirror 160 such as shown in FIG. 1. According to beneficial examples, the mirror 160 may be positioned closer to the sample 140, such as in a space between the sample 140 and the detector 118 or the objective lens 116. According to yet another beneficial embodiment, the electrode 450 can be combined with a sensor for sensing a static electric field, such as the sample charge sensor 350 described in detail with reference to FIG. 3. While exposing the sample 140 to the primary charged particle beam, the electrode 450 may be utilized as a sensor, such as the sample charge sensor 350. While exposing the sample 140 to the light beam 170, the electrode 450 may function as a mirror 160 for directing the light beam 170 onto the sample 140, and simultaneously function as an electrode for collecting electrons emitted by the sample.

Figure 5:
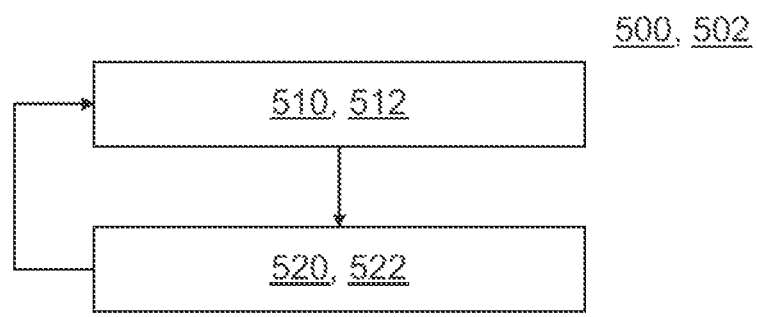
FIG. 5 shows a method of controlling sample charge in a charged particle beam apparatus and a method of controlling sample charge in a vacuum chamber according to embodiments.

Referring now to FIG. 5, an exemplary method 500 of controlling sample charge in a charged particle beam apparatus is described. The charged particle beam apparatus may be any charged particle beam apparatus as described herein. In operation 510, a primary charged particle beam is directed onto an area on the sample. In operation 520, a pulsed light beam is directed onto the sample. The photon energy of the pulsed light beam is lower than the work function of the sample. A pulse of the pulsed light beam has an intensity to promote a non-linear photoemission of electrons from the sample. A pulse of the pulsed light beam may be provided as described earlier with reference to embodiments described herein.

According to embodiments, operations 510 and 520 may be repeated any number of times separately, in sequence or in any order. Operation 520 may result in a reduction of electric charges, particularly negative electric charges of or on the sample. Operation 520 may result in the neutralization of surface charges of the sample, i.e. neutralize any charged portions of the sample. Operation 520 may be performed conditionally, i.e. only when a certain amount of charges has accumulated in or on the sample and/or a certain electric field strength is present as a result of the charged sample. A threshold for a maximum field strength can be obtained when the sample or portions of the sample have a surface charge or surface potential of more than ±1 Volt (V), more than ±5 V, more than ±10 V, more than ±20 V or more than ±50 V or even up to ±100 V. A sample charge of less than ±5 V, less than ±3 V, less than ±2 V or less than ±1 V may be considered neutral. The accumulation of surface charges may be measured, monitored or observed as described earlier with reference to embodiments described herein.

Benefits of the embodiments described herein are a reduced number of elements, such as electron or ion guns, UV illumination devices or the like, required to be provided within e.g. an enclosure of the charged particle apparatus. Furthermore, unlike with UV-based charge control, typically no short wavelength associated radiation damage will occur to the sample or other components of the charged particle beam apparatus. This can beneficially reduce the risk of contaminating the sample or the apparatus, and can simplify the design of the charged particle beam apparatus. Furthermore, compared to known devices or methods used for charge control, the described embodiments can provide sample charge control in a comparably short time. This can improve the throughput if the charged particle apparatus is, e.g., an inspection device in a manufacturing process. Furthermore, since the light beam does not include short wavelength radiation, sampling of a wider range of samples including, for example, polymers or other organic substances, can be performed, without risking radiation damage.

According to an embodiment, a method of controlling a sample charge in a vacuum chamber is described. The method includes exposing the sample to radiation and directing a pulsed light beam onto the sample. The photon energy of the pulsed light beam is lower than the work function of the sample. A pulse of the pulsed light beam has an intensity to promote a non-linear photoemission of electrons from the sample.

Referring to FIG. 5, a method 502 of controlling sample charge in a vacuum chamber is described. The vacuum chamber may include any charged particle beam apparatus according to embodiments described herein. The vacuum chamber may further include apparatuses utilizing radiation for the characterization of a sample, such as microscopes, tomographs, spectrometers, crystallographs or the like. The radiation may result in an electric charging of the sample. The radiation may include ionizing radiation, such as alpha, beta or gamma particles or photons, high-energy photons such as UV radiation, X-ray radiation or the like. The radiation may include particle radiation, such as electrons, neutrons or ions, particularly low-energy electrons such as slow electrons. The radiation may be a combination of radiation types. In one example, the radiation may include ionizing radiation, such as X-ray radiation, and further include e.g. slow electrons provided by an electron gun to counteract the accumulation of positive charges on the sample.

In operation 512, a sample is exposed to radiation. The radiation may result in the accumulation of negative charges on or within the sample. In operation 522, a pulsed light beam is directed onto the sample. The photon energy of the pulsed light beam is lower than the work function of the sample. A pulse of the pulsed light beam has an intensity to promote a non-linear photoemission of electrons from the sample. A pulse of the pulsed light beam may be provided as described earlier with reference to embodiments described herein.

According to embodiments, operations 512 and 522 may be repeated any number of times separately, in sequence, in combination or in any order. Operation 520 may result in a reduction of charges, particularly negative charges of or on the sample. Operation 520 may result in the neutralization of surface charges of the sample, i.e. neutralize any charged portions of the sample. Operation 520 may be performed conditionally, i.e. only when a certain amount of charges has accumulated in or on the sample and/or a certain electric field strength is present as a result of the charged sample. A threshold for a maximum field strength can be obtained when the sample or portions of the sample have a surface charge or surface potential of more than ±1 Volt (V), more than ±5 V, more than ±10 V, more than ±20 V or more than ±50 V or even up to ±100 V. A sample charge of less than ±5 V, less than ±3 V, less than ±2 V or less than ±1 V may be considered neutral. The accumulation of surface charges may be measured, monitored or observed as described earlier with reference to embodiments described herein.

Further, the following beneficial implementations 1 through 22 are described herein:

1. A charged particle beam apparatus, comprising:
   a charged particle source to generate a primary charged particle beam;
   a sample holder to hold a sample for impingement of the primary charged particle beam on the sample;
   a pulsed laser configured to generate a pulsed light beam for impingement onto an area on the sample.
2. The charged particle beam apparatus according to implementation 1, wherein the pulsed laser is configured to emit the pulsed light beam as an ultrashort light pulse with a pulse length of 1 picosecond or below.
3. The charged particle beam apparatus according to implementation 1 or 2, wherein the ultrashort light pulse has a peak power of more than 1 megawatt.
4. The charged particle beam apparatus according to any of the preceding implementations, the charged particle source further comprising an electrode configured to accelerate charged particles to form the primary charged particle beam;
   a bender unit configured to adjust a path of the primary charged particle beam;
   an objective lens configured to focus the primary charged particle beam onto a spot comprised in the area on the sample, the primary charged particle beam passing through a bore of the objective lens as the primary charged particle beam propagates from the charged particle source to the sample.
5. The charged particle beam apparatus according to any of the preceding implementations, further comprising a mirror disposed within the bender unit and arranged to direct the light beam onto the area on the sample.
6. The charged particle beam apparatus according to any of the preceding implementations, further comprising an optical fiber arrangement to direct the pulsed light beam from the pulsed laser.
7. The charged particle beam apparatus according to any of the preceding implementations, further comprising an electrode to collect electrons emitted from the sample in a non-linear photoemission.
8. The charged particle beam apparatus according to any of the preceding implementations, wherein the mirror comprises an electrode to collect electrons emitted in a non-linear photoemission.
9. The charged particle beam apparatus according to any of the preceding implementations, wherein the charged particle beam apparatus comprises a focusing assembly to focus the pulsed light beam onto the area on the sample.
10. The charged particle beam apparatus according to any of the preceding implementations, further including an intensity modulator, the intensity modulator being configured to adjust the intensity of a pulse of the pulsed light beam generated by the pulsed laser to generate a non-linear photoemission of electrons from the sample, particularly the photon energy of the pulsed light beam being lower than the work function of the sample.
11. The charged particle beam apparatus according to any of the preceding implementations, wherein the intensity modulator includes one or more of the following to adjust the intensity of the pulsed light beam:
   a focusing assembly to control the area impinged by the pulsed light beam;
   a pulse-width modulator to control the duration of a pulse of the pulsed light beam;
   a pulse power modulator to control the power of a pulse of the pulsed light beam;
   an intensity attenuator to control the intensity of a pulse of the pulsed light beam.
12. The charged particle beam apparatus according to any of the preceding implementations, wherein the apparatus is configured for scanning the primary charged particle beam across a scanning area on the sample.
13. The charged particle beam apparatus according to any of the preceding implementations, further comprising a detector configured to detect signal charged particles generated on impingement of the primary charged particle beam on the sample.
14. An electron beam inspection system, comprising the charged particle apparatus according to any of the preceding implementations, the electron beam inspection system being configured for inspecting the sample.
15. The charged particle beam apparatus or the electron beam inspection system according to any of the preceding implementations, wherein the sample comprises at least one of
   a semiconductor portion;
   an insulating portion;
   a photolithographic mask portion;
   a calibration measurement target; or
   a resolution measurement target.
16. A method of controlling sample charge in a charged particle beam apparatus, the charged particle beam apparatus directing a primary charged particle beam onto an area on a sample, the method comprising:
   directing a pulsed light beam onto the sample;
   the photon energy of the pulsed light beam being lower than the work function of the sample; and
   a pulse of the pulsed light beam having an intensity to promote a non-linear photoemission of electrons from the sample.
17. The method according to any of the preceding implementations, the method further including detecting charged particles emitted or reflected from the sample on impingement of the primary charged particle beam to obtain information corresponding to the sample.
18. The method according to any of the preceding implementations, the method further including adjusting the pulse intensity of a pulse of the pulsed light beam to control the number of electrons emitted from the sample according to the surface charge of the sample.
19. The charged particle beam apparatus according to any of the preceding implementations, further comprising a controller, the controller being configured to control the pulsed laser to generate the pulsed light beam, the controller controlling the pulsed laser according to at least one of the following:
   controlling the pulsed laser to generate a pulse of the pulsed light beam synchronized to a line-scan frequency or frame scan frequency of the charged particle beam; or
   controlling the pulsed laser to generate a pulse of the pulsed light beam with a variable pulse intensity, the pulse intensity corresponding to a surface charge of the area on the sample.
20. A charged particle beam apparatus, comprising:
   a charged particle source to generate a primary charged particle beam;
   a sample holder to hold a sample for impingement of the primary charged particle beam on the sample;
   a light source configured to generate a pulsed light beam for impingement onto an area on the sample, the photon energy of the pulsed light beam being lower than the work function of the sample;

an intensity modulator, the intensity modulator adjusting the intensity of a pulse of the pulsed light beam to generate a non-linear photoemission of electrons from the sample;

a controller, the controller being configured to control the light source to generate the pulsed light beam, the controller controlling the light source according to at least one of the following:

controlling the light source to generate a pulse of the pulsed light beam synchronized to a line-scan frequency or frame scan frequency of the charged particle beam; or controlling the light source to generate a pulse of the pulsed light beam with a variable pulse intensity, the pulse intensity corresponding to a surface charge of the area on the sample.

21. The charged particle beam apparatus according to any of the preceding implementations, further comprising a sample charge sensor, wherein the sample charge sensor senses an electric charge of the sample and provides the sensed sample charge to the controller, the controller being configured to control the pulse intensity of a pulse of the pulsed light beam according to the sensed sample charge.

22. A method of controlling sample charge in a vacuum chamber, including:

exposing a sample to radiation;

directing a pulsed light beam onto the sample;

the photon energy of the pulsed light beam being lower than the work function of the sample; and a pulse of the pulsed light beam having an intensity to promote a non-linear photoemission of electrons from the sample.

While the foregoing is directed to some embodiments, other and further embodiments may be devised without departing from the basic scope, and the scope is determined by the claims that follow.

The invention claimed is:

1. A charged particle beam apparatus, comprising:
a charged particle source to generate a primary charged particle beam;
a sample holder to hold a sample for impingement of the primary charged particle beam on the sample;
a pulsed laser configured to generate a pulsed light beam for impingement onto an area on the sample; and
an electrode to collect electrons emitted from the sample in a non-linear photoemission.

2. The charged particle beam apparatus according to claim 1, wherein the pulsed laser is configured to emit the pulsed light beam as an ultrashort light pulse with a pulse length of 1 picosecond or below.

3. The charged particle beam apparatus according to claim 2, wherein the ultrashort light pulse has a peak power of more than 1 megawatt.

4. The charged particle beam apparatus according to claim 1, the charged particle source further comprising an electrode configured to accelerate charged particles to form the primary charged particle beam;
a bender unit configured to adjust a path of the primary charged particle beam; and
an objective lens configured to focus the primary charged particle beam onto a spot comprised in the area on the sample, the primary charged particle beam passing through a bore of the objective lens as the primary charged particle beam propagates from the charged particle source to the sample.

5. The charged particle beam apparatus according to claim 4, further comprising a mirror disposed within the bender unit and arranged to direct the pulsed light beam onto the area on the sample.

6. The charged particle beam apparatus according to claim 4, further comprising an optical fiber arrangement to direct the pulsed light beam from the pulsed laser.

7. The charged particle beam apparatus according to claim 5, wherein the mirror comprises an electrode to collect electrons emitted in a non-linear photoemission.

8. The charged particle beam apparatus according to claim 1, wherein the charged particle beam apparatus comprises a focusing assembly to focus the pulsed light beam onto the area on the sample.

9. The charged particle beam apparatus according to claim 1, further including an intensity modulator, the intensity modulator being configured to adjust the intensity of a pulse of the pulsed light beam generated by the pulsed laser to generate a non-linear photoemission of electrons from the sample, particularly the photon energy of the pulsed light beam being lower than the work function of the sample.

10. The charged particle beam apparatus according to claim 9, wherein the intensity modulator includes one or more of the following to adjust the intensity of the pulsed light beam:
a focusing assembly to control the area impinged by the pulsed light beam;
a pulse-width modulator to control the duration of a pulse of the pulsed light beam;
a pulse power modulator to control the power of a pulse of the pulsed light beam;
an intensity attenuator to control the intensity of a pulse of the pulsed light beam.

11. The charged particle beam apparatus according to claim 1, wherein the charged particle beam apparatus is configured for scanning the primary charged particle beam across a scanning area on the sample.

12. The charged particle beam apparatus according to claim 1, further comprising a detector configured to detect signal charged particles generated on impingement of the primary charged particle beam on the sample.

13. An electron beam inspection system, comprising the charged particle beam apparatus according to claim 1, the electron beam inspection system being configured for inspecting the sample.

14. The charged particle beam apparatus according to claim 1, wherein the sample comprises at least one of
a semiconductor portion;
an insulating portion;
a photolithographic mask portion;
a calibration measurement target; or
a resolution measurement target.

15. The charged particle beam apparatus according to claim 1, further comprising a controller, the controller being configured to control the pulsed laser to generate the pulsed light beam, the controller controlling the pulsed laser according to at least one of the following:
controlling the pulsed laser to generate a pulse of the pulsed light beam synchronized to a line-scan frequency or frame scan frequency of the charged particle beam; or
controlling the pulsed laser to generate a pulse of the pulsed light beam with a variable pulse intensity, the pulse intensity corresponding to a surface charge of the area on the sample.

16. A method of controlling sample charge in a vacuum chamber, including:

exposing a sample to radiation;
directing a pulsed light beam onto the sample;
the photon energy of the pulsed light beam being lower than the work function of the sample; and
a pulse of the pulsed light beam having an intensity to promote a non-linear photoemission of electrons from the sample.

\* \* \* \* \*